(12) United States Patent
You et al.

(10) Patent No.: US 11,864,401 B2
(45) Date of Patent: Jan. 2, 2024

(54) LIGHT EMITTING DEVICE AND LIGHTING DEVICE COMPRISING RESONANCE AUXILIARY LAYER

(71) Applicant: LG Display Co., Ltd., Seoul (KR)

(72) Inventors: JiNa You, Daejeon (KR); JaeMin Moon, Seoul (KR); JuHyuk Kwon, Seoul (KR); SunHee Lee, Seoul (KR); JungHyoung Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 428 days.

(21) Appl. No.: 16/900,254

(22) Filed: Jun. 12, 2020

(65) Prior Publication Data

US 2020/0395565 A1 Dec. 17, 2020

(30) Foreign Application Priority Data

Jun. 14, 2019 (KR) .......................... 10-2019-0070830

(51) Int. Cl.
*H10K 50/11* (2023.01)
*H10K 50/15* (2023.01)
(Continued)

(52) U.S. Cl.
CPC ............. *H10K 50/11* (2023.02); *H10K 50/15* (2023.02); *H10K 50/171* (2023.02); *H10K 50/814* (2023.02); *H10K 2101/30* (2023.02); *H10K 2101/40* (2023.02); *H10K 2102/103* (2023.02); *H10K 2102/351* (2023.02)

(58) Field of Classification Search
None
See application file for complete search history.

(56) References Cited

U.S. PATENT DOCUMENTS

| 8,476,624 B1 | 7/2013 | Wu et al. |
| 2009/0295282 A1 | 12/2009 | Yoon et al. |

(Continued)

FOREIGN PATENT DOCUMENTS

| CN | 102347452 A | 2/2012 |
| CN | 102784437 A | 11/2012 |

(Continued)

OTHER PUBLICATIONS

Chinese Office Action dated Nov. 18, 2021 issued in corresponding Patent Application No. 202010544493.0 w/English Translation (18 pages).

(Continued)

*Primary Examiner* — Daniel Whalen
(74) *Attorney, Agent, or Firm* — Polsinelli PC

(57) ABSTRACT

A light emitting device includes a substrate; a first electrode disposed on the substrate; an organic material layer disposed on the first electrode and including a first resonance auxiliary layer; and a second electrode disposed on the organic material layer, wherein the first resonance auxiliary layer includes a first compound with a lowest unoccupied molecular orbital (LUMO) level of −4 eV or less and a second compound with a highest occupied molecular orbital (HOMO) level of −4 eV or less, and wherein the first resonance auxiliary layer has a thickness of 20% to 90% of a total thickness of the organic material layer.

17 Claims, 8 Drawing Sheets

(51) Int. Cl.
*H10K 50/17* (2023.01)
*H10K 50/814* (2023.01)
*H10K 101/40* (2023.01)
*H10K 101/30* (2023.01)
*H10K 102/10* (2023.01)
*H10K 102/00* (2023.01)

(56) References Cited

U.S. PATENT DOCUMENTS

| | | |
|---|---|---|
| 2014/0361269 A1 | 12/2014 | Kim et al. |
| 2015/0087685 A1 | 3/2015 | Khan et al. |
| 2016/0133840 A1 | 5/2016 | Song et al. |
| 2017/0141342 A1 | 5/2017 | Lee et al. |
| 2018/0033995 A1* | 2/2018 | Kim ............... H01L 51/5004 |
| 2018/0062083 A1 | 3/2018 | Kim et al. |
| 2021/0104697 A1* | 4/2021 | Ohsawa ........... H01L 51/5044 |

FOREIGN PATENT DOCUMENTS

| | | |
|---|---|---|
| CN | 103579522 A | 2/2014 |
| CN | 104218161 A | 12/2014 |
| CN | 104395428 A | 3/2015 |
| CN | 106478358 A | 3/2017 |
| CN | 107275370 A | 10/2017 |
| CN | 107665956 A | 2/2018 |

OTHER PUBLICATIONS

Chinese Notice of Registration and Grant dated Nov. 2, 2022 issued in Patent Application No. 202010544493.0 w/English Translation (8 pages).

L i bo et al., "Synthesis of an Electroluminescent Organic Compound and Testing on Its Luminescent Properties", College of Material Science, Northwest Industrial University, Xi an 710072, China. Physical Testing and Chemical Analysis, Part B: Chemical Analysis, vol. 43, Nov. 7, 2007, (11 pages).

* cited by examiner

LIGHT EMITTING DEVICE AND LIGHTING DEVICE COMPRISING RESONANCE AUXILIARY LAYER

CROSS REFERENCE TO RELATED APPLICATION

This application claims priority from Korean Patent Application No. 10-2019-0070830, filed on Jun. 14, 2019, which is hereby incorporated by reference in its entirety.

BACKGROUND

Field of the Disclosure

The present disclosure relates to a light emitting device and a lighting device.

Description of the Background

Skin of a person can be often damaged by aging of cells, repetition of specific expressions, continuous exposure to the external environment (ultraviolet rays, fine dust, and so on) and stress. For example, aging of cells or repetition of any specific facial expression may most likely cause wrinkles on the skin, and continuous exposure to the external environment or stress may result in various skin troubles such as acne, freckles, and the like.

Skin care for preventing or minimizing such an undesired damage to the skin is aimed at maintaining clean, soft skin without any blemishes, particularly, paying most attention to facial skin care.

In the recent years, lighting devices for cosmetic treatment, which may be in use attached to or worn on a user's face to output light, have been more often introduced in the market. Such lighting devices may be commonly provided with a plurality of light sources, so that light in a specific wavelength band can be irradiated onto the user's facial skin.

A lighting device for cosmetic treatment may be typically attached to the skin or used at a very close distance to the skin so that light irradiated to the skin can be absorbed up to a dermal layer of the skin. Furthermore, for a better esthetic effect, the light will have to be irradiated to the skin for a predetermined time or longer.

Therefore, such a cosmetic treatment lighting device should be able to irradiate the light with an output power high enough to achieve a cosmetic effect on the skin, while suppressing its heat generation in order to prevent skin burns.

SUMMARY

The present disclosure provides a light emitting device and a lighting device capable of preventing skin burns due to heat generation by operating with an excellent light output and a low driving voltage.

According to one aspect, a light emitting device includes a substrate, a first electrode disposed on the substrate, an organic material layer disposed on the first electrode and including a first resonance auxiliary layer, and a second electrode disposed on the organic material layer, the first resonance auxiliary layer including a first compound with a lowest unoccupied molecular orbital (LUMO) level of −4 eV or less and a second compound with a highest occupied molecular orbital (HOMO) level of −4 eV or less, and the first resonance auxiliary layer having a thickness of 20% to 90% of the total thickness of the organic material layer.

Here, the first compound may be HAT-CN (Hexaazatriphenylene-hexacarbonnitrile).

Further, the second compound may be NPB(N, N'-Bis-(1-naphthalenyl)-N, N'-bis-phenyl-(1,1'-biphenyl)-4,4'-diamine).

According to another aspect, the organic material layer may include a first stack, a second stack, and a charge generation layer, wherein the charge generation layer may be located between the first stack and the second stack.

Here, the first stack may include a first resonance auxiliary layer and a first light emitting layer, and may be positioned between the charge generation layer and the first electrode.

Here, the second stack may include a second light emitting layer, and may be located between the charge generation layer and the second electrode.

Here, the second light emitting layer may emit light having a wavelength of 550 nm to 700 nm.

According to still another aspect of the present disclosure, a lighting device includes a substrate including a plurality of pixels and the aforementioned light emitting device disposed in each pixel of the substrate.

According to the aspects of the present disclosure, a light emitting device improves the light output by introducing a resonance auxiliary layer thick enough to achieve an effect of improved light output due to micro-cavity effect, as well as providing the suppressed heat generation due to a low driving voltage, notwithstanding with thicker organic material layer.

According to the aspects of the present disclosure, it is also possible to provide a lighting device for use in skin care capable of achieving an excellent light output and the suppressed heat generation.

DESCRIPTION OF DRAWINGS

The above, other features and advantages of the present disclosure will be more clearly understood from the following detailed description, taken in conjunction with the accompanying drawings, in which.

DETAILED DESCRIPTION

Figure 1:
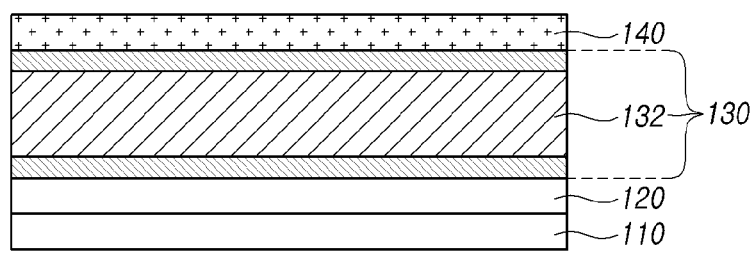
FIG. 1 is a cross-sectional view schematically showing a light emitting device according to aspects of the present disclosure.

In the following description of examples or aspects of the present disclosure, reference will be made to the accompanying drawings in which it is shown by way of illustration specific examples or aspects that can be implemented, and in which the same reference numerals and signs can be used to designate the same or like components even when they are shown in different accompanying drawings from one another. Further, in the following description of examples or aspects of the present disclosure, detailed descriptions of well-known functions and components incorporated herein will be omitted when it is determined that the description may make the subject matter in some aspects of the present disclosure rather unclear. The terms such as "including", "having", "containing", "constituting", "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 is a cross-sectional view schematically showing a light emitting device according to aspects of the present disclosure A light emitting device according to the present disclosure may include a substrate 110, a first electrode 120, an organic material layer 130, and a second electrode 140.

The substrate 110 may be formed of a transparent material. When the substrate 110 is formed of such a transparent material, light emitted from the light emitting device may be extracted out of the light emitting device through the substrate 110.

The type of the substrate 110 is not particularly limited, and for example, a glass substrate or a plastic substrate may be used for it. In particular, when flexibility is required for the light emitting device, a polymer plastic substrate may be used.

On one surface of the substrate 110, although not shown in FIG. 1, may be provided a plurality of protrusions formed in repeatedly. The plurality of protrusions may be a micro-lens array (MLA), and may be formed for the purpose of increasing the light extracted through the substrate 110.

The first electrode 120 may be disposed on the substrate 110. For example, when the micro-lens array is formed on one surface of the substrate 110, the first electrode 120 may be located on the opposite surface of the surface of the substrate on which the micro lens array is formed.

The first electrode 120 may be of an anode electrode. Therefore, holes may be supplied from the first electrode 120 to the organic material layer.

The first electrode 120 may include a transparent conductive material. For example, the first electrode 120 may include either one of indium tin oxide (ITO), indium zinc oxide (IZO), and indium gallium zinc oxide (IGZO) as the transparent conductive material.

The first electrode 120 including the transparent conductive material as described above, may be a transparent electrode having light transmittance of 80% or more. When the first electrode is a transparent electrode, the light emitted from the organic material layer may pass through the first electrode and then be extracted out of the light emitting device.

The organic material layer 130 may be disposed on the first electrode 120. As the organic material layer 130 is positioned on the first electrode 120 and the second electrode 140 is positioned on the organic material layer 130, holes and electrons may be transferred to the organic material layer 130 to cause light emission.

The organic material layer 130 may include an organic material, and it may mean one or more layers through which the holes and electrons are supplied from/to the first electrode 120 and the second electrode 140.

The organic material layer 130 may include one or more light emitting layers (not shown). The light emitting layer may refer to a layer in which light is emitted due to bonding of holes and electrons, and the light emitting layer may include, for example, a host material and a dopant material.

The organic material layer 130 may include a first resonance auxiliary layer 132.

The first resonance auxiliary layer 132 may serve to adjust a distance between the light emitting layer (not shown) included in the organic material layer 130 and the first electrode 120 and/or a distance between the light emitting layer (not shown) and the second electrode 140, so that more light emitted from the organic material layer 130 can be extracted owing to the micro-cavity effect.

The first resonance auxiliary layer 132 may include a first compound and a second compound.

The first compound may have a lowest unoccupied molecular orbital (LUMO) level of −4 eV or less. For example, the first compound may be at least one selected from tetrafluoro-tetracyanoquinodimethane (F4TCNQ: 7,7,8,8-Tetracyano-2,3,5,6-tetrafluoroquinodimethane), fluorine substituted 3,4,9,10-perylenetetracarboxylic dianhydride (PTCDA: 3,4,9,10-Perylentetracarboxilic dianhydride), cyano substituted PTCDA, naphthalene tetracarboxylic dianhydride (NTCDA: 1,4,5,8-naphthalene-tetracarboxilic dianhydride), Hexanitrile hexaaza-triphenylenene (HAT: Hexanitrile hexaaza-triphenylenene), and hexaazatriphenylene hexacarbonnitrile (HAT-CN: Hexaazatriphenylene-hexacarbon nitrile).

As an example, the first compound may be HAT-CN (Hexaazatriphenylene-hexacarbon nitrile). When HAT-CN is used as the first compound, it is possible to suppress an increase in driving voltage of the light emitting device due to an increased thickness of the organic material layer caused by the first resonant auxiliary layer is formed thicker, and generate the light with high output even though it is driven at a low voltage and a low current density.

The second compound may have a highest occupied molecular orbital (HOMO) level of −4 eV or less. The lower limit of the HOMO level of the second compound may be −9 eV or more. The second compound may at least one selected from, for example, NPB(N, N'-Bis-(1-naphthalenyl)-N, N'-bis-phenyl-(1,1'-biphenyl)-4,4'-diamine) (or also referred to as NPD(N,N'-Bis(naphthalene-1-yl)-N,N'-bis (phenyl) benzidine) in the same series), TPD(N,N'-bis-(3-methylphenyl)-N,N'-bis-phenyl)-benzidine), s-TAD and MTDATA(4, 4',4"-Tris(N-3-methylphenyl-N-phenylamino)-triphenylamine).

As an example, the second compound may be NPB(N, N'-Bis-(1-naphthalenyl)-N, N'-bis-phenyl-(1,1'-biphenyl)-4, 4'-diamine). When NPB is used as the second compound, it is possible to suppress an increase in driving voltage of the light emitting device due to an increased thickness of the organic material layer even though the first resonant auxiliary layer is formed thick, and then generate the light with high output caused by it is driven at a low voltage and a low current density.

In another example, the first compound may be HAT-CN, and the second compound may be NPB. When the first compound and the second compound are selected as described above, it is possible to further suppress an increase in driving voltage of the light emitting device due to increased thickness of the first resonance auxiliary layer, and emit the light with higher output power even when it is driven at a low voltage and a low current density.

The first resonance auxiliary layer 132 may have a thickness of 500 Å to 6000 Å. The lower limit of the thickness of the first resonance auxiliary layer 132 may be, for example, 600 Å or more, 700 Å or more, or 800 Å or more, and the upper limit of the thickness of the first resonance auxiliary layer 132 may be, for example, 3000 Å or less, or 2000 Å or less, or 1000 Å or less.

The first resonance auxiliary layer 132 may have a thickness of 20% to 90% with respect to a total thickness of the organic material layer 130. Here, the total thickness of the organic material layer 130 may mean a total sum of thicknesses of layers arranged between the first electrode 120 and the second electrode 140. The lower limit of the ratio of the thickness of the first resonance auxiliary layer 132 to the total thickness of the organic material layer 130 may be, for example, 30% or more, or 35% or more. The upper limit of the ratio of the thickness of the first resonance auxiliary layer 132 to the total thickness of the organic material layer 130 may be, for example, 85% or less, or 80% or less. Since the rest of the layers other than the resonance auxiliary layer, among the layers included in the organic material layer 130, has a thickness of about 100 Å to 300 Å, the resonance auxiliary layer can have a thickness meeting complying with the aforementioned range with respect to the total thickness of the organic material layer, when the resonance auxiliary layer included in the organic material layer 130 falls within the above thickness range.

Even though the first resonance auxiliary layer 132 is formed to have larger thickness, it does not make the driving voltage so much increased. Thus, by forming the thickness of the first resonance auxiliary layer 132 thick as described above to adjust the cavity length, it is possible to make a light emitting device having high luminance even though it is driven with a low driving voltage, as well as improving light extraction due to a micro-cavity effect.

The second electrode 140 may be disposed on the organic material layer 130, wherein the second electrode 140 may be, for example, a cathode electrode. Therefore, the organic material layer 130 may be disposed between the first electrode 120 and the second electrode 140, and holes and electrons are supplied from the first electrode 120 and the second electrode 140 to the organic material layer 130.

The second electrode 140 may include a reflective material. The reflective material may be any one of metals such as, for example, aluminum (Al), silver (Ag), molybdenum (Mo), copper (Cu) or silver (Ag), and alloys such as titanium molybdenum (MoTi), although not limited thereto.

The reflectivity of the second electrode 140 may be 50% or more, but is not limited thereto.

When the first electrode 120 is a transparent electrode including a transparent conductive material, and the second electrode 140 is a reflective electrode including a reflective material, the light extraction efficiency of the light emitting device can be improved owing to the micro-cavity effect.

The organic material layer 130 may include a first light emitting layer 134. The first light emitting layer 134 may be a layer in which the holes and electrons supplied from the first electrode 120 and the second electrode 140 are bonded to emit light.

Any specific limitation is not put to the material forming the first light emitting layer 134, and any suitable known material may be used therefor.

Figure 2:
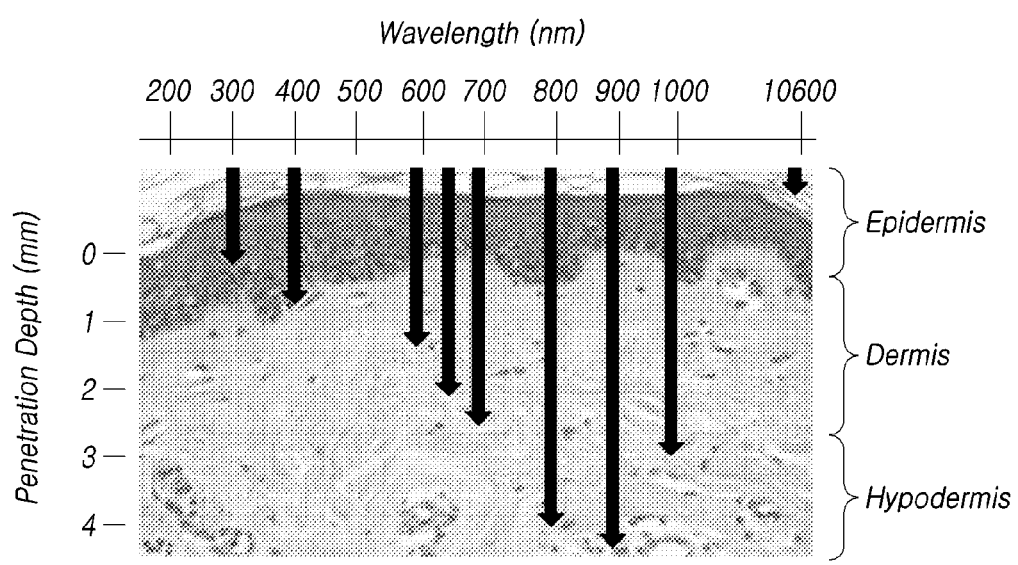
FIG. 2 is a view for explaining the effect on the skin according to the wavelength of light.

As an example, the first light emitting layer 134 may emit light having a wavelength of 550 nm to 700 nm. FIG. 2 is a view for explaining the effect on the skin according to the wavelength of the light.

Referring now to FIG. 2, it is seen that the light having a wavelength in the above-described range can penetrate beyond the epidermal tissue of the skin up to the dermal tissue thereof. The light penetrating into the dermal tissue of the skin can have some degree of cosmetic treatment effects, such as for example, cell conduction, surface circulation, and release of inflammation and so on, which can be eventually quite helpful and effective for skin beauty.

When the first light-emitting layer emits light having a wavelength in the aforementioned range, the light emitted from the first light-emitting layer may have treatment effects such as e.g., cell conduction, surface circulation, release of inflammation, and so on, so that those light emitting devices can be effectively utilized for skin beauty or skin care.

Figure 3:
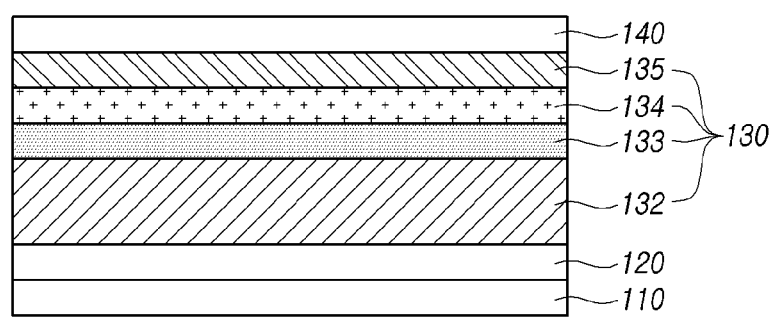
FIGS. 3 to 7 are cross-sectional views schematically showing a light emitting device according to aspects of the present disclosure.

FIG. 3 is a cross-sectional view schematically showing a light emitting device according to aspects of the present disclosure.

Referring to FIG. 3, in the light emitting device according to aspects of the present disclosure, an organic material layer 130 may further include a first resonance auxiliary layer 132, a first hole transport layer 133, a first light emitting layer 134, and an electron transport layer 135.

The first hole transport layer 133 may be disposed between the first electrode 120 and the first light emitting layer 134. Here, the first electrode 120 may be an anode electrode, and the first hole transport layer 133 may be disposed between the first electrode 120 and the first light emitting layer 134 to transport the holes supplied from the anode electrode to the first light emitting layer 134.

As a material forming the first hole transport layer 133, a known hole transporting material may be used as required.

The first resonance auxiliary layer 132 may be positioned between the first electrode 120 and the first hole transport layer 133. In the above examples, the first electrode 120 may be an anode electrode, and the first resonance auxiliary layer 132 may be positioned between the first electrode 120 and the first hole transport layer 133 to transport the holes supplied from the anode electrode to the first hole transport layer 133. Furthermore, as described above, the first resonance auxiliary layer 132 may be formed thicker than the first hole transport layer 133 and the first light emitting layer 134 in order to maximize the light extraction effect due to the micro-cavity effect.

In the above examples, the first resonance auxiliary layer 132 may be positioned in direct contact with the first hole transport layer 133. Therefore, the first resonance auxiliary layer 132 may be positioned between the first electrode 120, which is an anode electrode, and the first hole transport layer 133, and the first resonance auxiliary layer 132 may be then disposed in direct contact with the first hole transport layer 133. When the first resonance auxiliary layer 132 is positioned in direct contact with the first hole transport layer 133, the driving voltage of the light emitting device can be kept low even though the first resonance auxiliary layer 132 is formed relatively thicker, thereby significantly enhancing the luminance owing to the micro-cavity effect.

Figure 4:
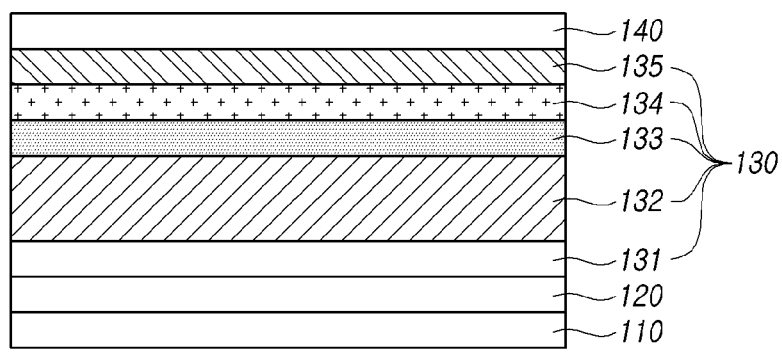

FIG. 4 is a cross-sectional view schematically showing a light emitting device according to aspects of the present disclosure.

Referring now to FIG. 4, in the light emitting device according to aspects of the present disclosure, the organic material layer 130 may include a hole injection layer 131.

The hole injection layer 131 may be positioned between the first resonance auxiliary layer 132 and the first electrode 120, wherein the first electrode 120 may be an anode electrode, and the hole injection layer 131 allows holes supplied from the first electrode 120 to be transferred to the first resonance auxiliary layer 132 without loss.

As the material forming the hole injection layer 131, a known hole injection material may be used.

Figure 5:
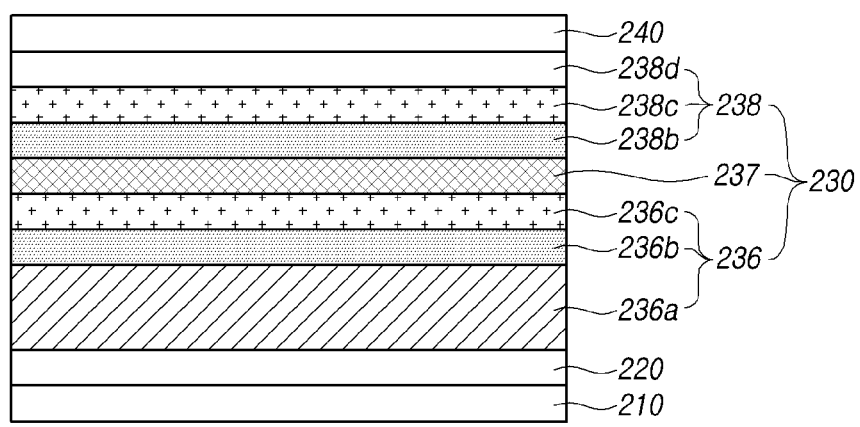

FIG. 5 is a cross-sectional view schematically showing a light emitting device according to aspects of the present disclosure.

Referring to FIG. 5, the light emitting device according to aspects of the present disclosure may include a substrate 210, a first electrode 220, an organic material layer 230, and a second electrode 240.

The organic material layer 230 may include a first stack 236, a charge generation layer 237, and a second stack 238, wherein the charge generation layer 237 may be positioned between the first stack 236 and the second stack 238.

The first stack 236 may include a first light emitting layer 236c, and the second stack 238 may include a second light emitting layer 238c. That is, each stack may include one or more light emitting layers, and a charge generation layer may be disposed between these stacks. The light emitting device in which a plurality of stacks including at least one light emitting layer are disposed between the first electrode 220 and the second electrode 240 can render better light output.

The first stack 236 may be disposed between the charge generation layer 237 and the first electrode 220, and the second stack 238 may be disposed between the charge generation layer 237 and the second electrode 240.

The first stack 236 may include a first resonance auxiliary layer 236a and a first light emitting layer 236c. As the first stack 236 includes the first resonant auxiliary layer 236a, the light extraction of the light emitting device may be improved due to the micro-cavity effect.

The second light emitting layer 238c may emit light having a wavelength of 550 nm to 700 nm. In the above examples, the first light emitting layer 236c and the second light emitting layer 238c may emit light having a wavelength of 550 nm to 700 nm. When the first light-emitting layer 236c and the second light-emitting layer 238c emit the light with the wavelength in the above-described range, it can further improve the skin care effect owing to the light emitted from the plurality of stacks of the light-emitting elements.

The first stack 236 may include a first hole transport layer 236b, wherein the first hole transport layer 236b may be positioned between the first electrode 220 and the first light emitting layer 236c. In the above examples, the first electrode 220 may be an anode electrode. As the first hole transport layer 236b is disposed between the first electrode 220 and the first light emitting layer 236c, the holes supplied from the first electrode 220 pass through the first hole transport layer 236b to be transferred to the first light emitting layer 236c.

The first resonance auxiliary layer 236a may be positioned between the first electrode 220 and the first hole transport layer 236b. When the first resonance auxiliary layer 236a included in the first stack 236 is positioned as described above, the light extraction of the light emitting device can be further increased by the micro-cavity effect, while keeping the driving voltage low.

The first resonance auxiliary layer 236a may be disposed in direct contact with the first hole transport layer 236b. When the first resonance auxiliary layer 236a is positioned in direct contact with the first hole transport layer 236b, it is possible to keep low the driving voltage of the light emitting device even though the first resonance auxiliary layer 236a is formed relatively thick, thereby rendering higher luminance owing to the micro-cavity effect.

The second stack 238 may include a second hole transport layer 238b and an electron transport layer 238d.

The second hole transport layer 238b may be positioned between the charge generation layer 237 and the second light emitting layer 238c, and the electron transport layer 238d may be positioned between the second light emitting layer 238c and the second electrode 240.

In the above examples, the first electrode 220 may be an anode electrode, and the second electrode 240 may be a cathode electrode.

Therefore, the second hole transport layer 238b may be positioned between the charge generation layer 237 and the second light emitting layer 238c, so that the holes generated from the charge generation layer 237 can be transferred to the second light emitting layer 238c.

In addition, the electron transport layer 238d may be positioned between the second light emitting layer 238c and the second electrode 240, so that the electrons supplied from the second electrode 240 can be transferred to the second light emitting layer 238c.

Figure 6:
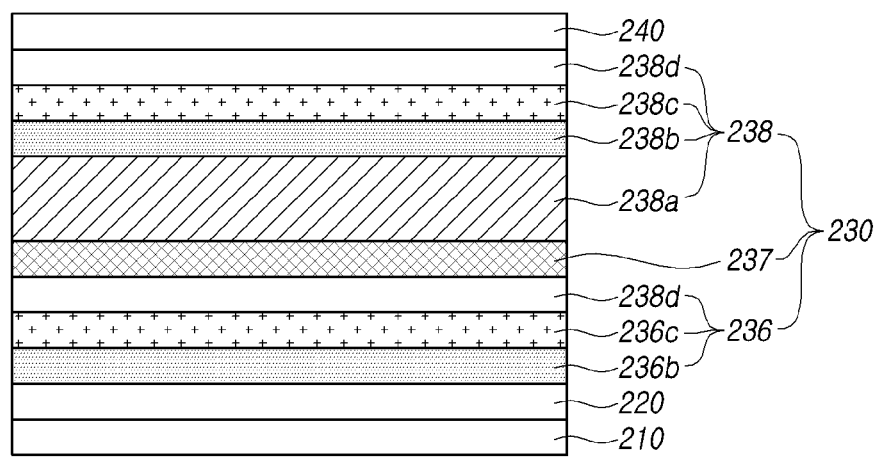

FIG. 6 is a cross-sectional view schematically showing a light emitting device according to aspects of the present disclosure.

Referring to FIG. 6, the light emitting device according to aspects of the present disclosure may include a substrate 210, a first electrode 220, an organic material layer 230, and a second electrode 240.

The organic material layer 230 may include a first stack 236, a charge generation layer 237, and a second stack 238, wherein the charge generation layer 237 may be positioned between the first stack 236 and the second stack 238.

The first stack 236 may include a first light emitting layer 236c, and the second stack 238 may include a second light emitting layer 238c. That is, each stack may include one or more light emitting layers, and the charge generation layer may be disposed between the stacks. The light emitting device in which a plurality of stacks including at least one light emitting layer are positioned between the first electrode 210 and the second electrode 240 may provide better light output.

The first stack 236 may be disposed between the charge generation layer 237 and the first electrode 220, and the second stack 238 may be disposed between the charge generation layer 237 and the second electrode 240.

The second stack 238 may include a first resonance auxiliary layer 238a and a second light emitting layer 238c. Thus, as the second stack 238 includes the first resonant auxiliary layer 238a, the light extraction of the light emitting device can be further improved by micro-cavity effect.

The second light emitting layer 238c can emit light having a wavelength of 550 nm to 700 nm. In the above examples, the first light emitting layer 236c and the second light emitting layer 238c can emit the light having a wavelength of 550 nm to 700 nm. When the first light emitting layer 236c and the second light emitting layer 238c emit the light having a wavelength in the above-described range, it can further enhance the skin care effect owing to the light emitted from the plurality of stacks of light emitting elements.

The first stack 236 may include a first hole transport layer 236b. The first hole transport layer 236b may be positioned between the first electrode 220 and the first light emitting layer 236c. In the above examples, the first electrode 220 may be an anode electrode. Since the first hole transport layer 236b is positioned between the first electrode 220 and the first light emitting layer 236c, the holes supplied from the first electrode 220 may pass through the first hole transport layer 236b to be transferred to the first light emitting layer 236c.

The second stack 238 may include a second hole transport layer 238b. The second hole transport layer 238b may be positioned between the charge generation layer 237 and the second light emitting layer 238c. Since the second hole transport layer 238b is positioned between the charge generation layer 237 and the second light emitting layer 238c, the holes generated in the charge generation layer 237 may pass through the second hole transport layer 238b to be transferred to the second light emitting layer 238c.

The first hole transport layer 236b and the second hole transport layer 238b may each include a known hole transport material. Further, the first hole transport layer 236b and the second hole transport layer 238b may include the same hole transport material, but may include any different hole transport materials.

The first resonance auxiliary layer 238a may be positioned between the charge generation layer 237 and the second hole transport layer 238b. When the first resonant auxiliary layer 238a included in the second stack 238 is positioned as described above, it can increase the light extraction of the light emitting device by the micro-cavity effect, while keeping the driving voltage relatively low.

The first resonance auxiliary layer 238a may be positioned in direct contact with the second hole transport layer 238b. When the first resonance auxiliary layer 238a is positioned in direct contact with the second hole transport layer 238b, the driving voltage of the light emitting device can be kept low even though the first resonance auxiliary layer 238a is formed relatively thick.

The following table shows, by way of an example only, a comparison in driving voltages and quantum efficiency between the light emitting device as shown in FIG. 6 and a light emitting device of a comparative example.

TABLE 1

| Experiments in 5 mA/cm2 | Driving Voltage(V) | Quantum Efficiency (%) |
|---|---|---|
| Disclosed aspect | 2.9 | 5.7 |
| Comparative Example | 3.9 | 5.8 |

The light emitting device of the disclosed aspect corresponds to the light emitting device shown in FIG. 6, wherein the first resonant auxiliary layer 238a includes HAT-CN as the first compound and NPB as the second compound, a weight ratio of the first compound to the second compound is about 8:2, and a thickness of the first resonance auxiliary layer is about 3000 Å. The light emitting device of the above comparative example is substantially the same as the light emitting device of the disclosed aspect, except that HAT-CN is not included in the layer corresponding to the first resonance auxiliary layer and only NPB is included therein.

Referring then to the above Table 1, it is seen that the disclosed aspect reveals the effect of driving voltage drop by about 30% compared to the comparative example at the same current density. It is meanwhile presumed that this is because the aspect is provided with the first resonant auxiliary layer including the first compound and the second compound. Therefore, the aspects of the present disclosure can achieve substantially the same luminance at a lower voltage due to the resonant auxiliary layer including the first compound and the second compound, so it can provide an advantage of low heat generation, while rendering an excellent cosmetic effect with light having a specific wavelength band.

Figure 7:
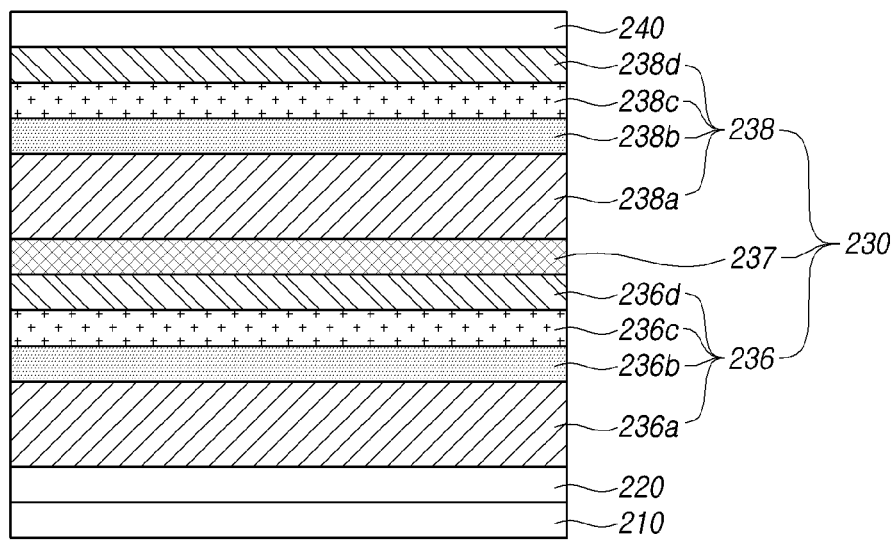

FIG. 7 is a cross-sectional view schematically showing a light emitting device according to aspects of the present disclosure.

Referring to FIG. 7, the light emitting device according to aspects of the present disclosure may include a substrate 210, a first electrode 220, an organic material layer 230, and a second electrode 240.

The organic material layer 230 may include a first stack 236, a charge generation layer 237, and a second stack 238, wherein the charge generation layer 237 may be disposed between the first stack 236 and the second stack 238.

The first stack 236 may include a first light emitting layer 236c, and the second stack 238 may include a second light emitting layer 238c. That is, each stack may include one or more light emitting layers, and the charge generation layer may be positioned between these stacks. The light emitting device in which a plurality of stacks including at least one light emitting layer are disposed between the first electrode 210 and the second electrode 240 can provide further increased light output.

The second light emitting layer 238c can emit light having a wavelength of 550 nm to 700 nm. In the above examples, the first light emitting layer 236c and the second light emitting layer 238c can emit the light having a wavelength of 550 nm to 700 nm. When the first light emitting layer 236c and the second light emitting layer 238c emit the light having the wavelength in the above-described range, it can further enhance the skin care effect by the light emitted from the plurality of stacks of light emitting elements.

The first stack 236 may be disposed between the charge generation layer 237 and the first electrode 220, and the second stack 238 may be disposed between the charge generation layer 237 and the second electrode 240.

The first stack 236 may include a first resonance auxiliary layer 236a and a first light emitting layer 236c, and the second stack 238 may include a second resonance auxiliary layer 238a and a second light emitting layer 238c. Since the first stack 236 includes the first resonant auxiliary layer 236a and the second stack 238 includes the second resonant auxiliary layer 238a, it can further enhance the light extraction from the light emitting device by the micro-cavity effect.

The second resonance auxiliary layer 238a may include a first compound and a second compound.

The first compound may have a lowest unoccupied molecular orbital (LUMO) level of −4 eV or less. For example, the first compound may be at least one selected from tetrafluoro-tetracyanoquinodimethane (F4TCNQ: 7,7,8,8-Tetracyano-2,3,5,6-tetrafluoroquinodimethane), fluorine-substituted 3,4,9,10-perylenetetracarboxylic dianhydride (PTCDA: 3,4,9,10-Perylentetracarboxilic dianhydride), cyano-substituted PTCDA, naphthalene tetracarboxylic dianhydride (NTCDA: 1,4,5,8-naphthalene-tetracarboxilic dianhydride), Hexanitrile hexaaza-triphenylenene (HAT: Hexanitrile hexaaza-triphenylenene), and hexaazatriphenylene hexacarbonnitrile (HAT-CN: Hexaazatriphenylene-hexacarbon nitrile).

As an example, the first compound may be HAT-CN (Hexaazatriphenylene-hexacarbon nitrile). When HAT-CN is used as the first compound, it is possible to suppress an increase in driving voltage of the light emitting device according to an increased thickness of the organic material layer, even though the second resonant auxiliary layer is formed thick.

The second compound may have a highest occupied molecular orbital (HOMO) level of −4 eV or less. The lower limit of the HOMO level of the second compound may be −9 eV or more. The second compound may at least one selected from, for example, NPB(N, N'-Bis-(1-naphthalenyl)-N, N'-bis-phenyl-(1,1'-biphenyl)-4,4'-diamine) (or also referred to as NPD (N, N'-Bis(naphthalene-1-yl)-N,N'-bis (phenyl) benzidine) in the same series), TPD(N,N'-bis-(3-methylphenyl)-N,N'-bis-phenyl)-benzidine), s-TAD and MTDATA(4, 4',4"-Tris(N-3-methylphenyl-N-phenylamino)-triphenylamine).

As an example, the second compound may be NPB(N, N'-Bis-(1-naphthalenyl)-N, N'-bis-phenyl-(1,1'-biphenyl)-4, 4'-diamine). When the NPB is used as the second compound, it is possible to suppress an increase in driving voltage of the light emitting device according to an increased thickness of the organic material layer, even though the second resonant auxiliary layer is formed thick.

The first compound and the second compound included in the first resonance auxiliary layer 236a and the second resonance auxiliary layer 238a may be substantially the same or different from each other.

In another example, the first compound may be HAT-CN, and the second compound may be NPB. When the first compound and the second compound are selected as described above, it makes it possible to further suppress an increase in driving voltage of the light emitting device due to an increased thickness of the second resonance auxiliary layer.

The second resonance auxiliary layer 238a may have a thickness of 500 Å to 6000 Å. The lower limit of the thickness of the second resonance auxiliary layer 238a may be, for example, 600 Å or more, 700 Å or more, or 800 Å or more, while the upper limit of the thickness of the second resonance auxiliary layer 238a may be, for example, 3000 Å or less, or 2000 Å or less, or 1000 Å or less.

The first stack 236a may include a first hole transport layer 236b, wherein the first hole transport layer 236b may be positioned between the first electrode 220 and the first light emitting layer 236c. In the above examples, the first electrode 220 may be an anode electrode. Therefore, since the first hole transport layer 236b is positioned between the first electrode 220 and the first light emitting layer 236c, the holes supplied from the first electrode 220 can be transferred through the first hole transport layer 236b to the first light emitting layer 236c.

The first resonance auxiliary layer 236a may be positioned between the first electrode 220 and the first hole transport layer 236b. When the first resonance auxiliary layer 236a included in the first stack 236 is positioned as described above, it makes it possible to increase the light extraction of the light emitting device by micro-cavity effect, while keeping the driving voltage low The first resonance auxiliary layer 236a may be positioned in direct contact with the first hole transport layer 236b. When the first resonance auxiliary layer 236a is positioned in direct contact with the first hole transport layer 236b, it makes it possible to keep low the driving voltage of the light emitting device, even though the first resonance auxiliary layer 236a is formed relatively thicker.

The second stack 238 may include a second hole transport layer 238b, wherein the second hole transport layer 238b may be disposed between the charge generation layer 237 and the second light emitting layer 238c. In the above examples, the first electrode 220 may be an anode electrode, and the second electrode 240 may be a cathode electrode. Therefore, since the second hole transport layer 238b is positioned between the charge generation layer 237 and the second light emitting layer 238c, it makes it possible to transfer the holes generated from the charge generation layer 237 to the second light emitting layer 238c.

The second resonance auxiliary layer 238a may be positioned between the charge generation layer 237 and the second hole transport layer 238b. When the second resonance auxiliary layer 238a included in the second stack 238 is arranged as described above, it enables to further increase the light extraction of the light emitting device by the micro-cavity effect, while keeping the driving voltage low.

In the above aspects, the details relative to the substrate 210, the first electrode 220, and the second electrode 240 are substantially the same as those described above for the substrate 110, the first electrode 120, and the second electrode 140, unless specifically described otherwise.

Figure 8:
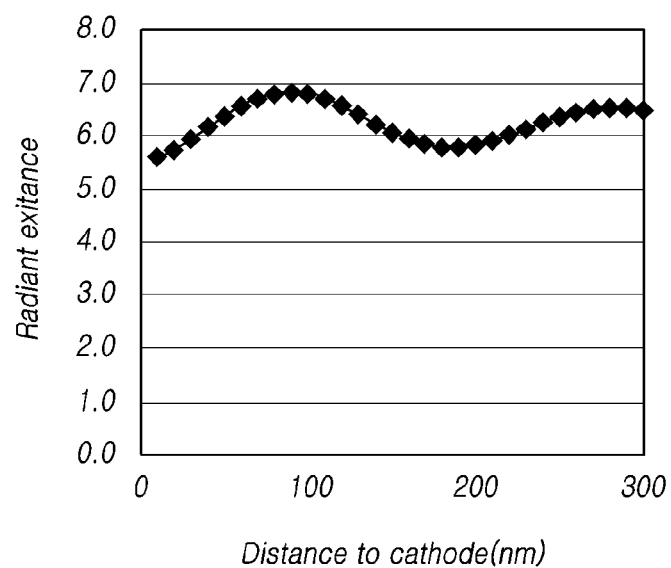
FIG. 8 is a graphic diagram for illustrating that the light extraction from a light emitting device according to aspects of the present disclosure changes according to the thickness of its resonance auxiliary layer.

FIG. 8 is a graphic diagram illustrating that the light extraction from a light emitting device according to aspects of the present disclosure changes according to the thickness of its resonance auxiliary layer.

Referring to FIG. 8, it is seen that the light extraction changes according to the thickness of the first resonance auxiliary layer 238a in the light emitting device as shown in FIG. 6. Thus, one can understand that the light extraction reveals a sinusoidal curve depending on the change in cavity length according to the change in thickness of the first resonance auxiliary layer 238a due to the micro-cavity effect. Therefore, even if the thickness of the light emitting device including the resonance auxiliary layer is augmented, it can maximize the light extraction of the light emitting device, by adjusting the cavity length to make a thicker resonance auxiliary layer while suppressing the increasing of the driving voltage.

According to another aspect of the present disclosure, it can provide a lighting device.

The lighting device according to the aspects of the present disclosure may include a substrate including a plurality of pixels and at least one light emitting device disposed in each pixel of the substrate.

The details related to the light emitting device included in this lighting device are substantially the same as those of the light emitting device according to the aspects of the present disclosure described heretofore, and thus will be omitted.

The above description has been presented to enable any person skilled in the art to make and use the technical idea of the present disclosure, and has been provided in the context of a particular application and its requirements. Various modifications, additions and substitutions to the described aspects will be readily apparent to those skilled in the art, and the general principles defined herein may be applied to other aspects and applications without departing from the spirit and scope of the present disclosure. The above description and the accompanying drawings provide an example of the technical idea of the present disclosure for illustrative purposes only. That is, the disclosed aspects are intended to illustrate the scope of the technical idea of the present disclosure. Thus, the scope of the present disclosure is not limited to the aspects shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A light emitting device comprising:
   a substrate;
   a first electrode disposed on the substrate;
   an organic material layer disposed on the first electrode and including a hole injection layer, a first resonance auxiliary layer, a first hole transport layer, and a light emitting layer; and
   a second electrode disposed on the organic material layer,
   wherein the first resonance auxiliary layer consisting of a single layer, and serves to adjust at least one of a distance between the light emitting layer included in the organic material layer and the first electrode and a distance between the light emitting layer and the second electrode,
   wherein the first resonance auxiliary layer includes a first compound with a lowest unoccupied molecular orbital (LUMO) level of −4 eV or less and a second compound with a highest occupied molecular orbital (HOMO) level of −4 eV or less.

2. The light emitting device according to claim 1, wherein the first compound includes a HAT-CN(Hexaazatriphenylene-hexacarbonnitrile).

3. The light emitting device according to claim 2, wherein the second compound includes NPB(N, N'-Bis-(1-naphthalenyl)-N, N'-bis-phenyl-(1,1'-biphenyl)-4,4'-diamine).

4. The light emitting device according to claim 2, wherein a weight ratio of the first compound to the second compound is 8:2.

5. The light emitting device according to claim 1, wherein the first electrode includes a transparent conductive material, and the second electrode includes a reflective material.

6. The light emitting device according to claim 1, wherein a first light emitting layer of the light emitting layer emits light having a wavelength of 550 nm to 700 nm.

7. The light emitting device according to claim 6,
   wherein the first hole transport layer is disposed between the first electrode and the first light emitting layer, and
   wherein the first resonance auxiliary layer is disposed between the first electrode and the first hole transport layer.

8. The light emitting device according to claim 7, wherein the first resonance auxiliary layer is disposed in direct contact with the first hole transport layer.

9. The light emitting device according to claim 7, wherein the hole injection layer is disposed between the first resonance auxiliary layer and the first electrode.

10. The light emitting device according to claim 6, wherein the organic material layer includes a first stack, a second stack, and a charge generation layer disposed between the first stack and the second stack,
    wherein the first stack includes the first resonance auxiliary layer and the first light emitting layer and is disposed between the charge generation layer and the first electrode,
    wherein the second stack includes a second light emitting layer and is disposed between the charge generation layer and the second electrode, and
    wherein the second light emitting layer emits light having a wavelength of 550 nm to 700 nm.

11. The light emitting device according to claim 10, wherein a first hole transport layer is included in the first stack,
    wherein the first hole transport layer is disposed between the first electrode and the first light emitting layer, and
    wherein the first resonance auxiliary layer is disposed between the first electrode and the first hole transport layer.

12. The light emitting device according to claim 11, wherein the first resonance auxiliary layer is disposed in direct contact with the first hole transport layer.

13. The light emitting device according to claim 10, wherein the second stack further includes a second hole transport layer and an electron transport layer,
    wherein the second hole transport layer is disposed between the charge generation layer and the second light emitting layer, and
    wherein the electron transport layer is disposed between the second light emitting layer and the second electrode.

14. The light emitting device according to claim 6, wherein the organic material layer includes a first stack, a second stack, and a charge generation layer disposed between the first stack and the second stack,
    wherein the first stack includes the first resonance auxiliary layer and the first light emitting layer and is disposed between the charge generation layer and the first electrode,
    wherein the second stack includes a second resonance auxiliary layer and a second light emitting layer and is disposed between the charge generation layer and the second electrode, and
    wherein the second resonance auxiliary layer includes a third compound with a lowest unoccupied molecular orbital (LUMO) level of −4 eV or less and a fourth compound with a highest occupied molecular orbital (HOMO) level of −4 eV or less,
    wherein the thickness of the second resonance auxiliary layer is 20% to 90% of a total thickness of the organic material layer, and
    wherein the second light emitting layer emits light having a wavelength of 550 nm to 700 nm.

15. The light emitting device according to claim 14, wherein the first stack further includes a first hole transport layer,
    wherein the second stack further includes a second hole transport layer,
    wherein the first hole transport layer is disposed between the first electrode and the first light emitting layer,
    wherein the first resonance auxiliary layer is disposed between the first electrode and the first hole transport layer, wherein the second hole transport layer is disposed between the charge generation layer and the second light emitting layer, and wherein the second resonance auxiliary layer is disposed between the charge generation layer and the second hole transport layer.

16. The light emitting device according to claim 1, wherein the first resonance auxiliary layer has a thickness of 20% to 90% of a total thickness of the organic material layer.

17. A lighting device comprising:
- a substrate including a plurality of pixels; and
- a light emitting device disposed on each pixel of the substrate and including a first electrode, an organic material layer and a second electrode;

wherein the first electrode is disposed on the substrate, wherein the organic material layer is disposed on the first electrode, and includes a hole injection layer, a first resonance auxiliary layer, a first hole transport layer, and a light emitting layer, wherein the second electrode is disposed on the organic material layer, wherein the first resonance auxiliary layer consisting of a single layer, and serves to adjust at least one of a distance between the light emitting layer included in the organic material layer and the first electrode and a distance between the light emitting layer and the second electrode, wherein the first resonance auxiliary layer includes a first compound with a lowest unoccupied molecular orbital (LUMO) level of −4 eV or less and a second compound with a highest occupied molecular orbital (HOMO) level of −4 eV or less, and wherein the thickness of the first resonance auxiliary layer is 20% to 90% of a total thickness of the organic material layer.

* * * * *